(12) United States Patent
Yednak, III

(10) Patent No.: US 12,449,084 B2
(45) Date of Patent: Oct. 21, 2025

(54) METHODS AND APPARATUS FOR HEATING A LIQUID

(71) Applicant: ASM IP Holding B.V., Almere (NL)

(72) Inventor: Andrew Michael Yednak, III, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/665,202

(22) Filed: May 15, 2024

(65) Prior Publication Data

US 2024/0301980 A1    Sep. 12, 2024

Related U.S. Application Data

(63) Continuation of application No. 17/944,296, filed on Sep. 14, 2022, now Pat. No. 11,988,316.

(60) Provisional application No. 63/245,461, filed on Sep. 17, 2021.

(51) Int. Cl.
*H01L 21/67* (2006.01)
*F16L 53/38* (2018.01)
*C23C 16/455* (2006.01)

(52) U.S. Cl.
CPC ........ *F16L 53/38* (2018.01); *H01L 21/67023* (2013.01); *C23C 16/45561* (2013.01); *Y10T 137/6416* (2015.04)

(58) Field of Classification Search
CPC ........ Y10T 137/6416; C23C 16/45561; H01L 21/67023
See application file for complete search history.

(56) References Cited

U.S. PATENT DOCUMENTS

| | | | |
|---|---|---|---|
| 5,630,878 A * | 5/1997 | Miyamoto | C23C 16/4485 118/725 |
| 6,195,504 B1* | 2/2001 | Horie | C23C 16/448 392/394 |
| 6,881,933 B2* | 4/2005 | Wickel | H05B 3/565 219/535 |
| 8,931,506 B2* | 1/2015 | Nagata | F02D 19/023 137/341 |
| 9,096,931 B2* | 8/2015 | Yednak, III | C23C 16/45512 |
| 11,976,356 B2* | 5/2024 | Nakatani | C23C 16/52 |
| 11,988,316 B2* | 5/2024 | Yednak, III | B01D 1/0041 |
| 2011/0217027 A1 | 9/2011 | Mulder et al. | |
| 2018/0174826 A1* | 6/2018 | Raaijmakers | C23C 16/45561 |

FOREIGN PATENT DOCUMENTS

| | | |
|---|---|---|
| CN | 102052754 A | 5/2011 |
| CN | 204880656 U | 12/2015 |
| CN | 207990995 U | 10/2018 |
| CN | 209101545 U | 7/2019 |
| CN | 209655557 U | 11/2019 |
| KR | 200404664 Y1 | 12/2005 |

* cited by examiner

*Primary Examiner* — Kevin F Murphy
(74) *Attorney, Agent, or Firm* — Snell & Wilmer L.L.P.

(57) ABSTRACT

An apparatus capable of heating a liquid may provide a valve assembly configured to receive an incoming liquid from a bulk source. The valve assembly may control the flow of the liquid to a source vessel via a pipe system. The pipe system includes a first pipe directly connected to the valve assembly and a second pipe downstream from the first pipe and connected between the first pipe and the source valve. The second pipe is heated with a heating system that surrounds the second pipe, and the second pipe has a larger diameter than that of the first pipe.

19 Claims, 6 Drawing Sheets

METHODS AND APPARATUS FOR HEATING A LIQUID

CROSS-REFERENCE TO RELATED APPLICATIONS

This application is a continuation of, and claims priority to and the benefit of, U.S. patent application Ser. No. 17/944,296, filed Sep. 14, 2022 and entitled "METHODS AND APPARATUS FOR HEATING A LIQUID," which is a nonprovisional of, and claims priority to and the benefit of, U.S. Provisional Patent Application No. 63/245,461, filed Sep. 17, 2021 and entitled "METHODS AND APPARATUS FOR HEATING A LIQUID," which are hereby incorporated by reference herein.

FIELD OF INVENTION

The present disclosure generally relates to methods and apparatus for heating a liquid in a pipe system. More particularly, the present disclosure relates to a system for selectively heating a liquid chemical used during the fabrication of semiconductor devices.

BACKGROUND OF THE DISCLOSURE

Equipment used during the fabrication of semiconductor devices may house a source vessel that is used directly to perform chemical reactions during the fabrication process. The source vessel may contain a liquid chemical that is heated to achieve the desired chemical reaction. The source vessel, however, must be refilled periodically, and conventional systems provide incoming liquid that is a lower temperature than that required for the desired chemical reaction. Accordingly, the refill liquid must be heated to the desired temperature to continue the chemical reaction. Heating the refill liquid to the desired temperature is time consuming and the fabrication process must be paused during such time. Conventional methods for pre-heating the liquid prior to entering the source vessel are not adequate in high-temperature processes due to the high temperature differential of the desired liquid temperature in the source vessel relative to the temperature of the incoming liquid.

SUMMARY OF THE DISCLOSURE

An apparatus capable of heating a liquid may provide a valve assembly configured to receive an incoming liquid from a bulk source. The valve assembly may control the flow of the liquid to a source vessel via a pipe system. The pipe system includes a first pipe directly connected to the valve assembly and a second pipe downstream from the first pipe and connected between the first pipe and the source valve. The second pipe is heated with a heating system that surrounds the second pipe, and the second pipe has a larger diameter than that of the first pipe.

BRIEF DESCRIPTION OF THE DRAWING FIGURES

These and other features, aspects, and advantages of the invention disclosed herein are described below with reference to the drawings of certain embodiments, which are intended to illustrate and not to limit the invention.

FIG. 1 representatively illustrates a system for heating a liquid in accordance with an exemplary embodiment of the present technology;

FIG. 2 representatively illustrates a system for heating a liquid in accordance with an alternative embodiment of the present technology;

Figure 5:
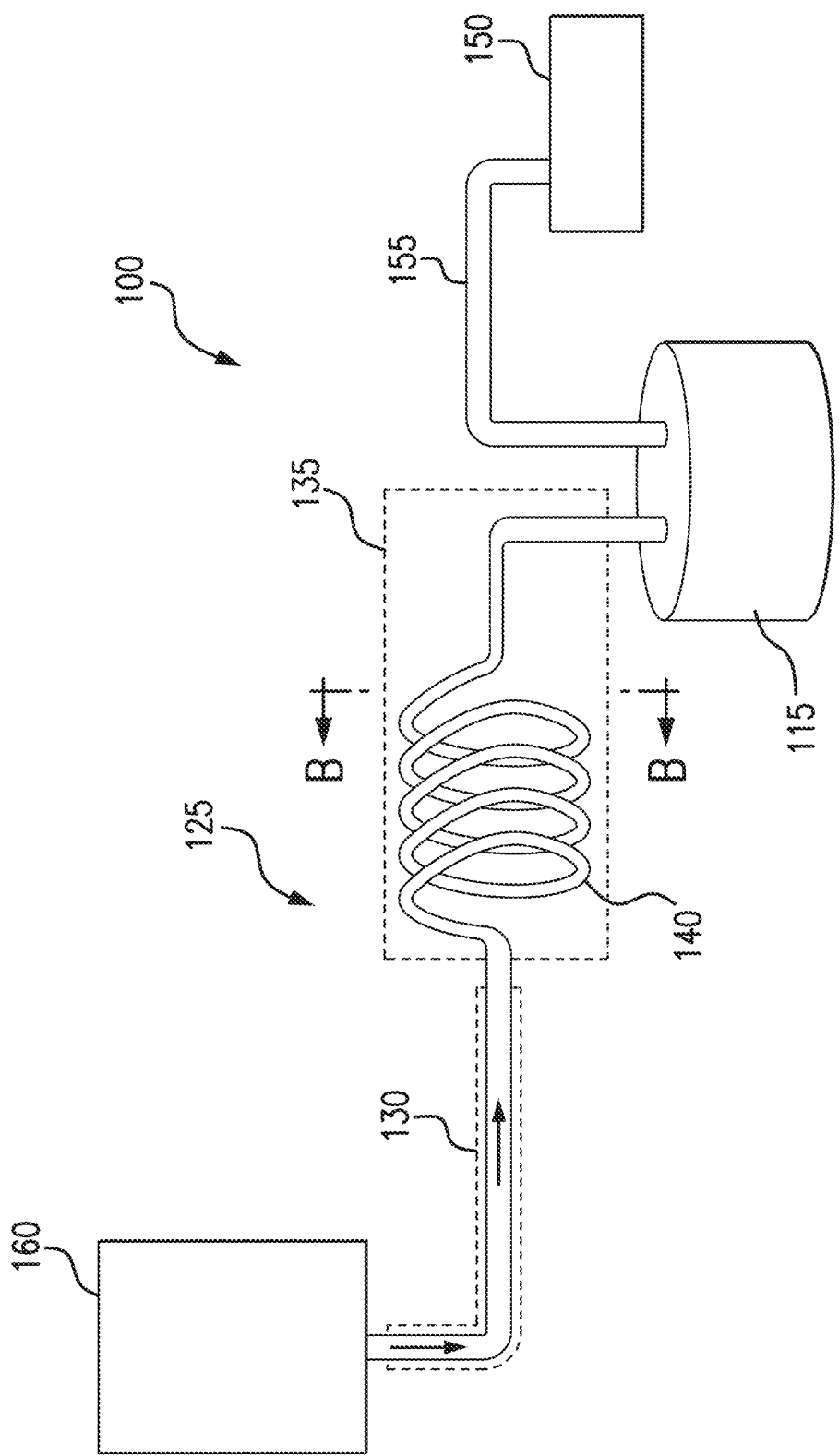
Figure 6:
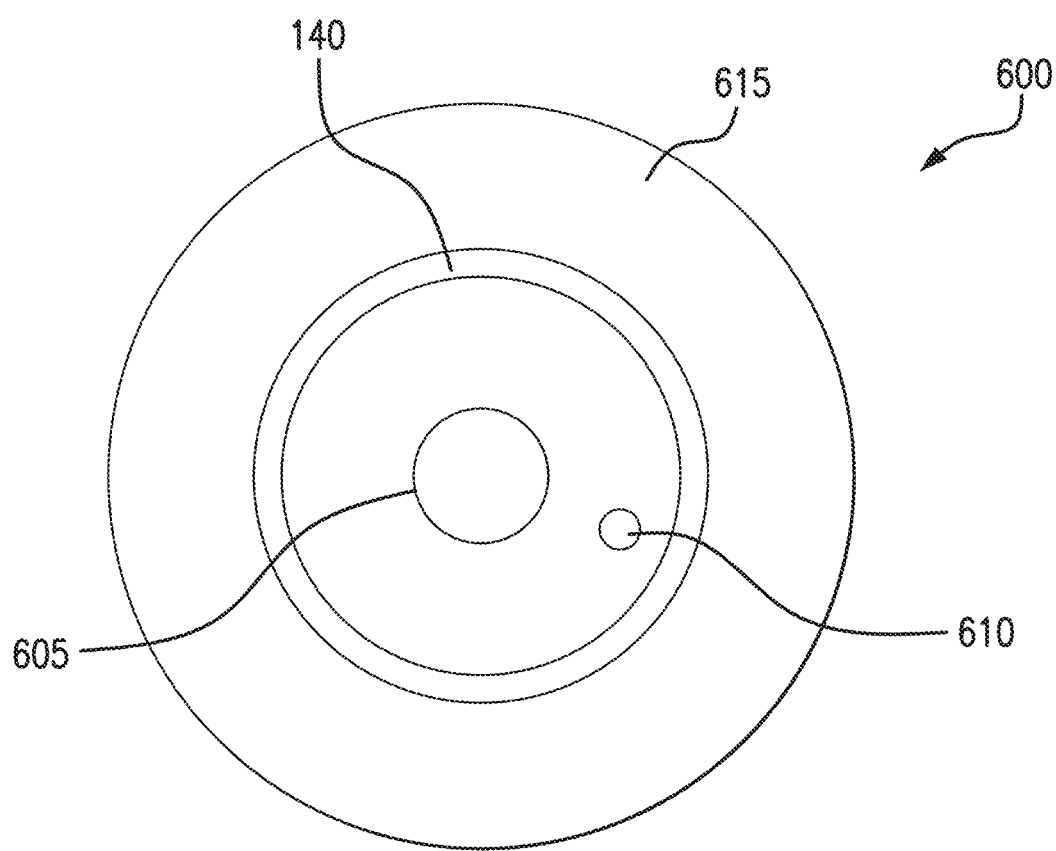
Figure 7:
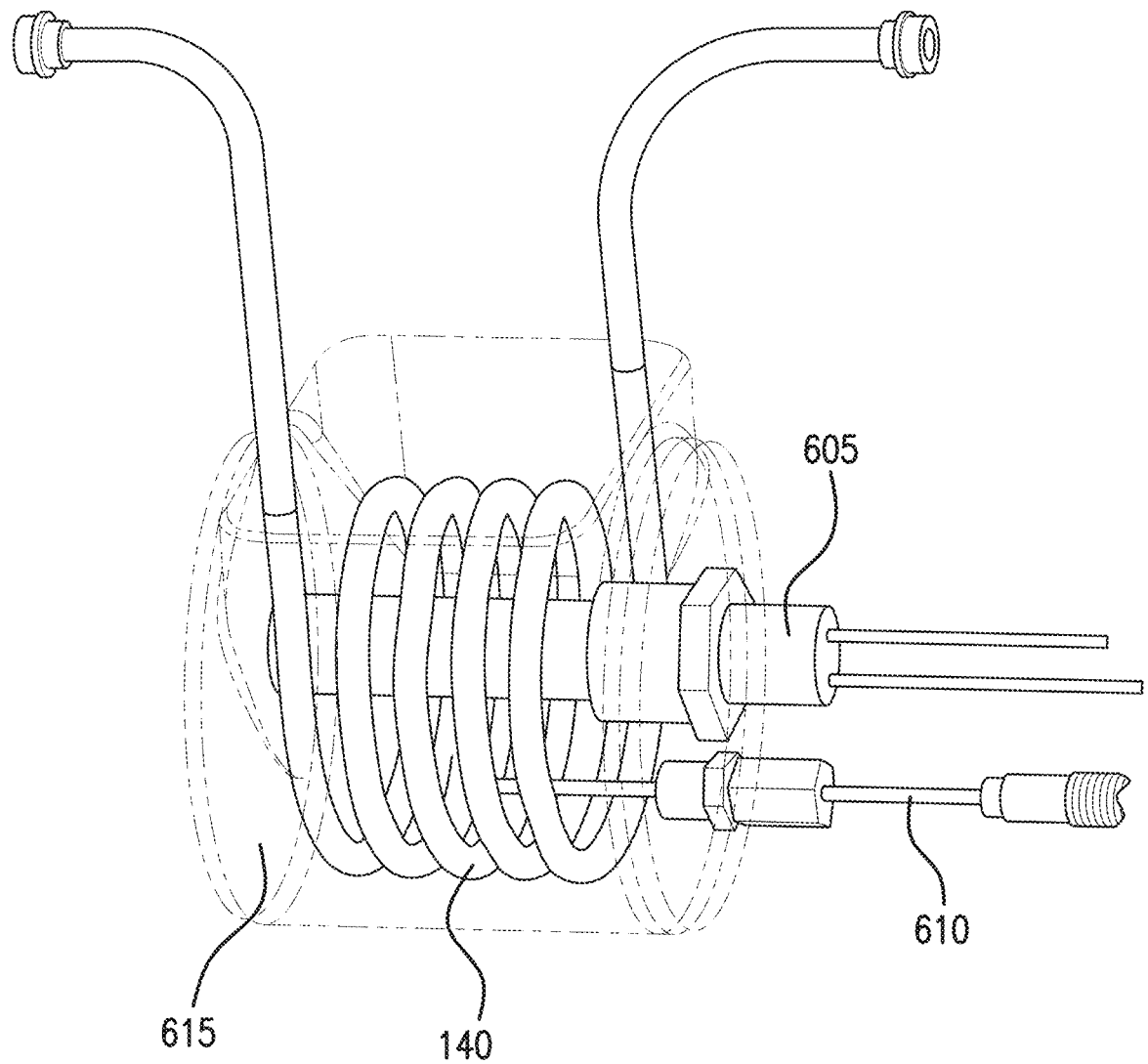

FIG. 5 representatively illustrates a system for heating a liquid in accordance with yet another embodiment of the present technology;

FIG. 6 is a cross-sectional view of a pipe system for heating a liquid in accordance with the exemplary system of FIG. 5; and FIG. 7 is a perspective view of a cast heater in accordance with an embodiment of the present technology.

It will be appreciated that elements in the figures are illustrated for simplicity and clarity and have not necessarily been drawn to scale. For example, the relative size of some of the elements in the figures may be exaggerated relative to other elements to help improve understanding of illustrated embodiments of the present disclosure.

DETAILED DESCRIPTION OF EXEMPLARY EMBODIMENTS

Figure 1:
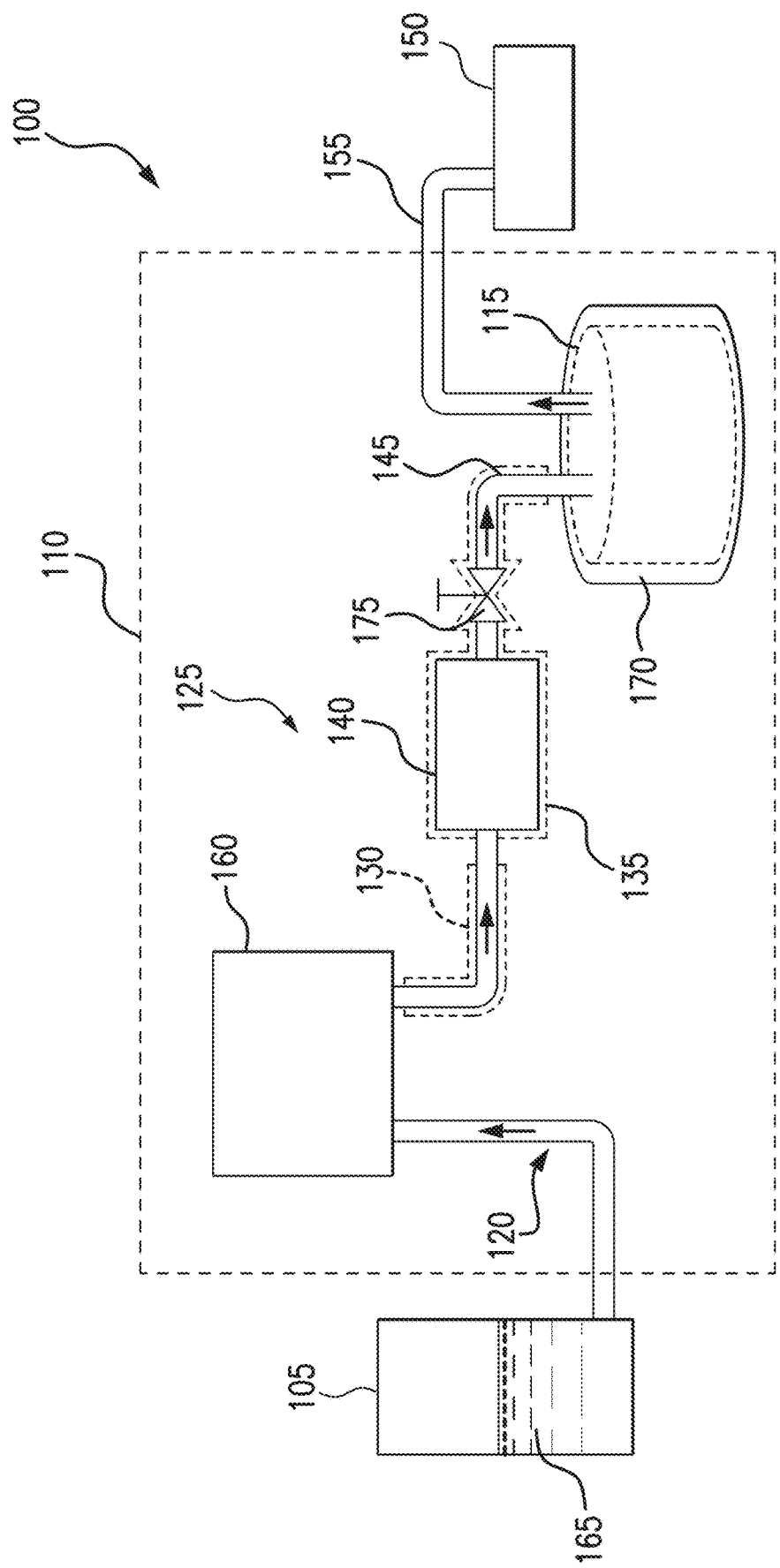

Reference will now be made to the drawings wherein like reference numerals identify similar structural features or aspects of the subject disclosure. For purposes of explanation and illustration, and not limitation, a partial view of an example of semiconductor processing system in accordance with the present disclosure is shown in FIG. 1 and is designated generally by reference character 100. Other examples of semiconductor processing systems in accordance with the present disclosure, or aspects thereof, are provided in FIGS. 2-6, as will be described. The systems and methods of the present disclosure may be used for heating a liquid, such as pre-heating a liquid before it enters a source vessel used in semiconductor processing, though the present disclosure is not limited to pre-heating a liquid prior to entering a source vessel used in semiconductor processing or to heating a liquid in general.

The description of exemplary embodiments provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of stated features.

The present disclosure generally relates to a system and an apparatus capable of heating a liquid. In addition, some aspects of the present technology are generally related to pre-heating a liquid before it enters a source vessel.

Referring to FIG. 1, a system 100 may comprise an external bulk container 105 to store a liquid 165, such as a chemical liquid used in a process for manufacturing a semiconductor device. The system 100 may further comprise a tool 110 for controlling the flow of the liquid 165 and/or producing a reaction chemical. The external bulk container 105 may be fluidly connected to a tool 110 that houses various pipes, valves, and liquid storage containers. For example, the external bulk container 105 may be connected to the tool 110 via a first pipe system 120 (also referred to as a first pipe sub-system). The liquid 165 in the external bulk container 105 may have a temperature in the range of 20 to 30 degrees Celsius, for example, approximately 25 degrees Celsius. In addition, the liquid 165 may maintain that temperature during flow through the first pipe system 120 and into the tool 110.

The first pipe system 120 may be configured to flow the liquid chemical 165 from the external bulk container 105 to the tool 110 and may comprise any number of pipes, pumps, and/or valves suitable to maintain a desired flow rate. In various embodiments, the first pipe system 120 may be made of a thermally conductive metal, such as aluminum or an aluminum alloy. In various embodiments, the first pipe system 120 is not heated by an external source. However, in other embodiments, the first pipe system 120 may be heated by an external source (not shown), such as a heater jacket or like.

The tool 110 may be configured to control the flow of the liquid 165 and/or heat the liquid 165. For example, the tool 110 may comprise a valve assembly 160, a second pipe system 125 (also referred to as a second pipe sub-system), a heating system, and a source vessel 115. In various embodiments, the tool 110 may further comprise a housing (not shown) to enclose the valve assembly 160, the second pipe system 125, the heating system, and the source vessel 115.

The valve assembly 160 may be configured to receive the incoming liquid 165 from the external bulk container 105 and control the flow of the liquid 165 to downstream components. For example, the valve assembly 160 may be connected to the first pipe system 120. The valve assembly 160 may comprise any number of valves, pumps, and/or controllers to control the flow of the liquid 165 from the first pipe system 120. The valves and/or pumps in the valve assembly may be controlled (i.e., opened and closed) valve assembly 160 may be controlled by an external controller, microprocessor, or other device or system (not shown) suitable for controlling the operation of the valve assembly 160. In some embodiments, the valve assembly 160 may be heated with a separately-controlled heating system or device.

In some embodiments, the valve assembly 160 may be limited to receive liquids at a temperature of 60 degrees Celsius or less. As such, the incoming and/or outgoing pipes directly connected to the valve assembly 160 may be limited to the temperature specifications of the valve assembly 160 for proper operation of the valve assembly 160. In addition, the liquid flowing into the valve assembly 160 may be limited to the same temperature specifications of the valve assembly 160 for proper operation of the valve assembly 160.

However, in other embodiments, the valve assembly 160 may itself be heated and therefore able to receive liquids at temperatures of 60 degrees Celsius or higher.

The second pipe system 125 may be configured to flow the liquid 165 from the valve assembly 160 to the source vessel 115. In various embodiments, the second pipe system 125 may comprise any number of pipes, valves, and the like, suitable for flowing the liquid 165 as desired. The second pipe system 125 may have any suitable length based on design constraints and/or physical constraints. In various embodiments, portions of the second pipe system 125 may be heated (e.g., with an external heating system) and others portions of the second pipe system 125 may not be heated.

In various embodiments, the second pipe system 125 may comprise a first portion 130 that is directly connected to the valve assembly 160. The first portion 130 may be make of any thermally conductive metal, such as aluminum or aluminum alloy. In various embodiments, the first portion 130 may not be heated by an external heating source because heating of the first portion 130 may interfere with the operation of the valve assembly 160, as discussed above. However, in other embodiments, the first portion 130 may be heated with an external heating source, such as a heater jacket or the like.

The first portion 130 may have any suitable a length, such as in the range of approximately 2 inches to 10 linear feet, and may have a diameter in the range of ⅛ inch to 3 inches. The length of the first portion 130 may be selected according to physical design constraints and/or to ensure that the valve assembly 160 is not inadvertently heated from downstream components. For example, the housing may define the physical space and may dictate the physical arrangement of the components within the tool 110. The first portion 130 may comprise any number of pipes, valves, and the like, suitable for flowing the liquid 165 from the valve assembly 160 to a second portion 135. For example, a valve (not shown) may be disposed between the first portion 130 and the second portion 135 to control the flow of liquid 165 from the first portion 130 to the second portion 135.

In various embodiments, the second pipe system 125 may further comprise the second portion 135 that is downstream from the first portion 130. Specifically, the second portion 135 may be connected between the first portion 130 and the source vessel 115. In various embodiments, the second portion 135 may be directly connected to the source vessel 115. Alternatively, the second portion 135 may be connected to the source vessel 115 via a valve (not shown).

The second portion 135 may have any suitable length, and the length of the second portion 135 may be selected according to physical design constraints. The second portion 135 may comprise any number of pipes, valves, and the like, suitable for flowing the liquid 165 from the first portion 130 to the source vessel 115.

In one embodiment, and referring to FIG. 1, the second portion 135 may comprise a first pipe 140 and a second pipe 145. The first pipe 140 may be downstream from and connected to the first portion 130. The second pipe 145 may be connected downstream from the first pipe 140 via a valve 175. The valve 175 may comprise any suitable valve, such as a shutoff valve, a directional valve, a diaphragm valve, a pneumatic valve, a manual valve, or the like, and the valve 175 and may be controlled (i.e., opened and closed) with the external controller (not shown) or microprocessor (not shown).

In the present case, the first pipe 140 may have a diameter that is greater than the first portion 130. For example, the first pipe 140 may have a diameter in the range of ¼ inch to 3 inches. In addition, the first pipe 140 may have a volume in the range of 1 liter to 5 liters. In other embodiments, the volume of the first pipe 140 may be greater than 5 liters. In the present embodiment, the second pipe 145 may have a diameter that is less than the first pipe 140. The diameter of the second pipe 145 may be equal to or greater than the diameter of the first portion 130. The second pipe 145 may be connected to the source vessel 115 via a valve (not shown) and/or an inlet tube (not shown).

In the present embodiment, the first pipe 140 may accumulate or otherwise hold the liquid 165. In other words, the liquid 165 may not flow continuously through the first pipe 140, but rather, may be stagnant for a period of time after the first pipe 140 has been filled to its maximum volume or other desired volume. During the stagnant period, the liquid 165 that has accumulated in the first pipe 140 may be heated to a desired temperature, such as in the range of 80 to 200 degrees Celsius, and more particularly, 100 to 120 degrees Celsius. In other cases, the liquid 165 may be heated above 200 degrees Celsius. The heating temperature may be only be limited by a maximum heating capacity of the heating element and/or the melting point of the material of the first pipe 140 and associated components. The valve 175 may be closed to allow the liquid 165 to accumulate in the first pipe 140 and may then be opened to allow the liquid 165 to flow through the second pipe 145 and into the source vessel 115.

Figure 2:
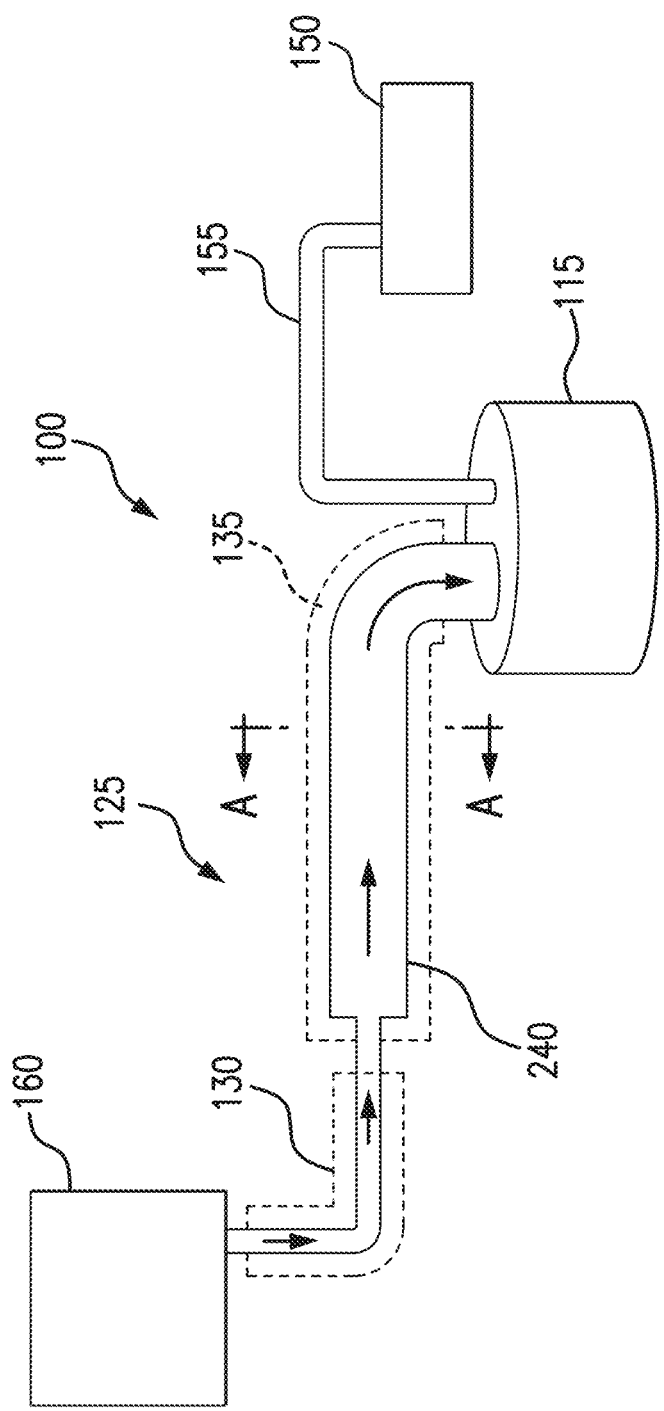

In an alternative embodiment, and referring to FIG. 2, the second portion 135 may comprise a single pipe 240 having a volume in the range of 1 to 5 liters and a diameter in a range of approximately ⅛ inch to approximately 3 inches. The pipe 240 may be connected downstream from the first portion 130. In the present case, the pipe 240 may be connected to the source vessel 115 via a valve (not shown) and/or an inlet tube (not shown).

In various embodiments, the pipe 240 may accumulate or otherwise hold the liquid 165. In other words, the liquid 165 may not flow continuously through the pipe 240, but rather, may be stagnant for a period of time after the pipe 240 has been filled to its maximum volume or other desired volume. During the stagnant period, the liquid 165 that has accumulated in the pipe 240 may be heated to a desired temperature, such as in the range of 80 to 200 degrees Celsius, and more particularly, 100 to 120 degrees Celsius. In other cases, the liquid 165 may be heated above 200 degrees Celsius. The heating temperature may be only be limited by a maximum heating capacity of the heating element and/or the melting point of the material of the first pipe 140 and associated components.

In various embodiments, the pipe 240 may be directly connected to the first portion 130. In alternative embodiments, the pipe 240 may be connected to the first portion 130 via a valve (not shown).

In various embodiments, the second portion 135 may be heated. For example, and referring to FIG. 4, the system 100 may comprise a heater jacket 400 surrounding the second portion 135 (e.g., the first pipe 140 or the first pipe 140 together with the second pipe 145). The heater jacket 400 may comprise a conventional heater jacket made of fabric and secured around the outer surface of the second portion 135 with a fastener, such as a hook and loop fastener or the like.

Figure 3:
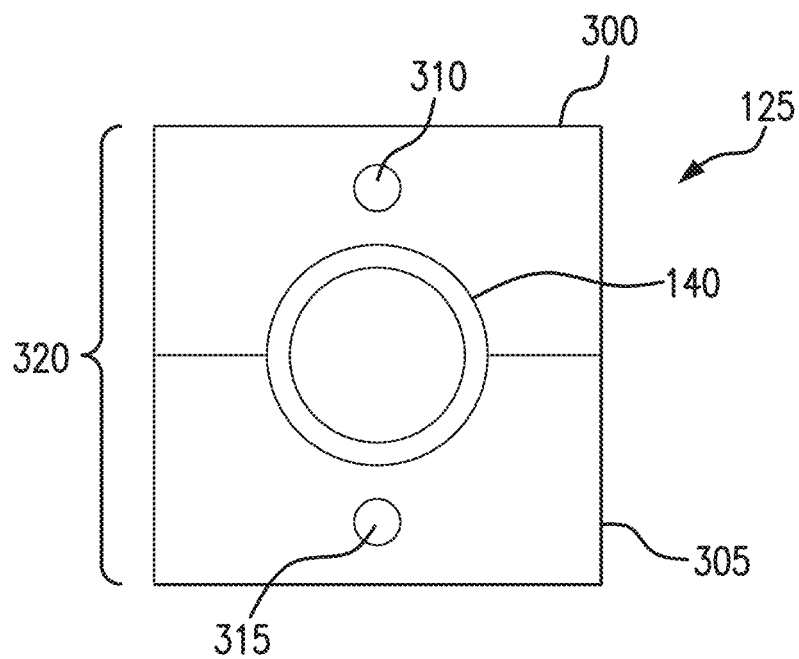
FIG. 3 is a cross-sectional view of a pipe system for heating a liquid in accordance with an exemplary embodiment of the present technology.
Figure 4:
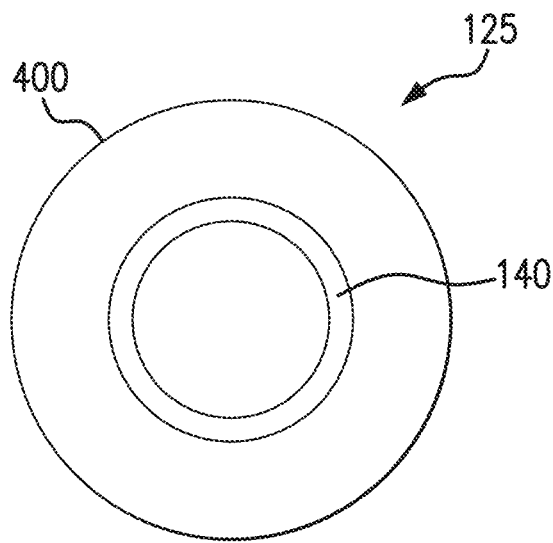
FIG. 4 is a cross-sectional view of a pipe system for heating a liquid in accordance with an alternative embodiment of the present technology.

In another embodiment, and referring to FIG. 3, the system 100 may comprise a clamp heater 320 surrounding the second portion 135 (e.g., the first pipe 140 or the pipe 240). The clamp heater 320 may comprise a first clamp portion 300 and a second clamp portion 305 arranged around the outer surface of the second portion 135 (e.g., the first pipe 140 or the pipe 240). The clamp heater 320 may further comprise heater elements 310, 315 arranged in an interior portion of the first and second clamp portions 300, 305, respectively. The heater elements 310, 315 may extend through the respective heater clamp portion 300, 305 and along the length of the second portion 135 (e.g., the first pipe 140 or pipe 240). The heater elements 310, 315 may comprise heater rods, heater cartridges, or the like.

In yet another embodiment, and referring to FIGS. 5 and 6, the system 100 may comprise a cast heater system 600. The cast heater system 600 may comprise an outer body 615 surrounding the first pipe 140. In the present case, the first pipe 140 is coiled around a heating rod 605 and a thermocouple 610. The heating rod 605 is suitably configured to generate heat, which is transferred to the first pipe 140, and thus capable of heating the liquid 165 inside the first pipe 140. The heating rod 605 may be electrically connected to a power source (not shown) and/or the controller (not shown) (or microprocessor (not shown)) to operate the heating rod 605.

Similarly, in an exemplary embodiment, the first pipe 140 may be coiled around the thermocouple 610, and the thermocouple 610 may be affixed to an outer surface the first pipe 140 The thermocouple 610 is configured to measure a temperature of the first pipe 140 and generates a signal (e.g., a voltage value) corresponding to the measured temperature. The thermocouple 610 may be electrically connected to the controller, wherein the controller may receive the signal and convert the signal to a numerical value.

The system 100 may further comprise a third pipe system 155 configured to flow a gas or vapor from the source vessel 115 to the reaction chamber 150 and may comprise any number of pipes, pumps, and/or values suitable to maintain a desired flow rate.

The source vessel 115 may be configured to hold or otherwise contain the liquid 165. The source vessel 115 may be any suitable shape and size. For example, the source vessel 115 may be a cylinder shape or a cube or cuboid shape. In addition, the source vessel 115 may be further configured to be air tight. For example, the source vessel 115 may comprise an air tight lid having gaskets or o-rings, made of a silicon or rubber, to prevent air from entering the source vessel 115. Alternatively, the lid may be welded to the source vessel 115. In various embodiments, the source vessel 115 may be heated with an external heating system 170, such as a heater jacket surrounding the source vessel 115, to ensure that the liquid inside the source vessel 115 maintains a desired temperature. The temperature of the source vessel 115 may be selected according to the particular application, process, chemical reaction, and the like. For example, the heating system 170 may heat the liquid in the source vessel 115 to approximately 120 degrees Celsius in order to perform a desired process or chemical reaction.

In various operations, and referring to FIG. 1, the controller (not shown) (or microprocessor (not shown)) may control the flow of the liquid 165 out of the external bulk container 105, through the first pipe system 120 and into the valve assembly 160. The controller (not shown) may then control the operation of the valve assembly 160 to flow the liquid 165 from the first pipe system 120, through the valve assembly 160, and into the second pipe system 125. In various operations, once the liquid 165 that is stored in the second portion 135 is heated, the liquid 165 from the second portion 135 is flowed into the source vessel 115.

In one operation, the liquid 165 may flow through the first portion 130 and then accumulate in the second portion 135, for example, in the first pipe 140. After the first pipe 140 has accumulated the liquid 165, the first pipe 140 may continue to store the liquid 165 until the liquid 165 is heated to a desired temperature. After the liquid 165 reaches the desired temperature, the liquid 165 may be flowed into the source vessel 115. In the present case, the liquid 165 may be flowed from the first pipe 140, then to the second pipe 145, and then to the source vessel 115.

In an alternative operation, the liquid 165 may flow through the first portion 130 and then accumulate in the second portion 135, for example, in the pipe 240. After the pipe 240 has accumulated the liquid 165, the pipe 240 may continue to store the liquid 165 until the liquid 165 is heated to a desired temperature. After the liquid 165 reaches the desired temperature, the liquid 165 may be flowed into the source vessel 115. In the present case, the liquid 165 may be flowed from the pipe 240 and then to the source vessel 115 without an intermediary pipe that is smaller in diameter than the pipe 240.

In various operations, the liquid 165, once heated, is flowed into the source vessel 115 until the source vessel 115 is full or reaches a desired level/volume in order to continue the reaction process.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The invention claimed is:

1. An apparatus for heating a liquid, comprising:
a valve assembly configured to receive the liquid;
a pipe system downstream from the valve assembly and configured to allow flow of the liquid, wherein the pipe system comprises:
   a first portion comprising a first pipe connected directly to the valve assembly and having a first diameter; and
   a second portion downstream from the first pipe, wherein the second portion comprises a second pipe having a second diameter that is greater than the first diameter,
wherein the second pipe is configured to accumulate the liquid therein;
a heating system arranged around the second portion configured to heat the liquid in the second pipe;
a source vessel connected to and downstream from the second portion, wherein the source vessel is configured to receive and contain heated liquid from the second pipe and configured to deliver a gas produced from the heated liquid to a reaction chamber for processing; and
the reaction chamber, which is connected to and downstream from the source vessel, wherein the reaction chamber is configured to receive the gas from the source vessel for semiconductor processing within the reaction chamber.

2. The apparatus of claim 1, further comprising a third pipe downstream from the source vessel.

3. The apparatus of claim 1, wherein the heating system comprises a cast heater surrounding the second portion, and wherein the cast heater comprises a heating cartridge.

4. The apparatus of claim 1, wherein the heating system comprises a heater jacket surrounding the second pipe.

5. The apparatus of claim 1, wherein the heating system comprises a clamp heater surrounding the second pipe.

6. The apparatus of claim 1, wherein the liquid received by the valve assembly has a temperature in a range of 20 to 30 degrees Celsius.

7. The apparatus of claim 1, wherein the heating system is configured to heat the liquid in the second portion to a temperature in a range of 100 to 120 degrees Celsius.

8. A system, comprising:
a bulk container configured to hold a liquid;
a first pipe system connected to and downstream from the bulk container and configured to allow flow of the liquid;
a valve assembly connected to and downstream from the first pipe system and configured to control the flow of the liquid;
a second pipe system connected to and downstream of the valve assembly, wherein the second pipe system comprises:
   a first pipe connected directly to the valve assembly and having a first diameter and configured to allow flow of the liquid; and
   a second pipe downstream from the first pipe and having a second diameter that is greater than the first diameter, wherein the second pipe is configured to accumulate the liquid therein;
a heating system arranged around the second pipe configured to heat the liquid in the second pipe;
a source vessel connected to and downstream from the second pipe system, wherein the source vessel is configured to receive and contain heated liquid from the second pipe and configured to deliver a gas produced from the heated liquid to a reaction chamber for processing; and
the reaction chamber, which is connected to and downstream from the source vessel, wherein the reaction chamber is configured to receive the gas from the source vessel for semiconductor processing within the reaction chamber.

9. The system of claim 8, wherein the first pipe lacks contact with the heating system.

10. The system of claim 8, further comprising a third pipe downstream from the source vessel.

11. The system of claim 8, wherein the heating system is configured to heat the accumulated volume of liquid in the second pipe system to a temperature in a range of 100 to 120 degrees Celsius.

12. The system of claim 8, wherein the bulk container is configured to hold a liquid having a temperature in a range of 20 to 30 degrees Celsius.

13. The system of claim 8, wherein:
the heating system comprises a cast heater surrounding the second pipe, and wherein the cast heater comprises a heating cartridge.

14. The system of claim 8, wherein the heating system comprises a heater jacket surrounding the second pipe.

15. A method for heating a volume of a liquid, comprising:
flowing the liquid from a bulk container to a valve assembly via a first pipe system, wherein the liquid flowing into the valve assembly has a temperature in a range of 20 to 30 degrees Celsius;
flowing the liquid through the valve assembly;
flowing the liquid from the valve assembly to a second pipe system, wherein the second pipe system comprises:
   a first pipe having a first diameter; and
   a second pipe downstream from the first pipe and having a second diameter that is greater than the first diameter;
accumulating the liquid in the second pipe;
heating the liquid in the second pipe;

flowing the heated liquid from the second pipe to a source vessel, and containing the heated liquid in the source vessel, wherein the source vessel is configured to deliver a gas produced from the heated liquid to a reaction chamber for processing.

16. The method of claim 15, further comprising:
flowing the gas from the source vessel directly to a third pipe located downstream from the source vessel.

17. The method of claim 15, wherein heating the liquid comprises providing a heating apparatus around the outside of the second pipe.

18. The method of claim 17, wherein heating the liquid in the second pipe comprises heating the liquid to a temperature in a range of 100 to 120 degrees Celsius.

19. The method of claim 15, wherein heating the liquid in the second pipe comprises heating the liquid to a temperature in a range of 80 to 200 degrees Celsius.

* * * * *